US007161395B2

(12) United States Patent
Xie

(10) Patent No.: US 7,161,395 B2
(45) Date of Patent: Jan. 9, 2007

(54) STATIC FREQUENCY DIVIDER WITH LOW POWER SUPPLY

(75) Inventor: Jingqiong Xie, Kanata (CA)

(73) Assignee: STMicroelectronics, Inc., Carrollton, TX (US)

( * ) Notice: Subject to any disclaimer, the term of this patent is extended or adjusted under 35 U.S.C. 154(b) by 224 days.

(21) Appl. No.: 10/875,351

(22) Filed: Jun. 24, 2004

(65) Prior Publication Data
US 2005/0285638 A1    Dec. 29, 2005

(51) Int. Cl.
*H03B 19/00* (2006.01)
(52) U.S. Cl. ..................... 327/117; 327/115
(58) Field of Classification Search ............... None
See application file for complete search history.

(56) References Cited

U.S. PATENT DOCUMENTS

| | | | |
|---|---|---|---|
| 4,730,349 A * | 3/1988 | Wilhelm et al. ............. 377/47 |
| 5,754,062 A | 5/1998 | Satoh et al. |
| 5,844,437 A | 12/1998 | Asazawa et al. |
| 5,900,760 A | 5/1999 | Lee |
| 5,969,556 A | 10/1999 | Hayakawa |
| 6,218,878 B1 | 4/2001 | Ueno |
| 6,268,752 B1 | 7/2001 | Takahashi et al. |
| 6,285,262 B1 * | 9/2001 | Kuriyama ................. 331/25 |
| 6,593,782 B1 | 7/2003 | Pierschel et al. |
| 6,903,579 B1 * | 6/2005 | Rylov et al. ............... 326/115 |

FOREIGN PATENT DOCUMENTS

JP    5-167402    7/1993

OTHER PUBLICATIONS

L. Masini et al., "A Low Voltage 12-GHz Silicon-Germanium Status Frequency Divider with a Selectable Division Ratio", Italy (date unknown).
S. Blueler et al., "A Static Frequency Divider in InP-DHBT Technology for Process Control", Diploma Thesis, Swiss Federal Institute of Technology Zurich, Mar. 2002.
Martin Wurzer, "TP 12.6 53GHz Static Frequency Divider in a Si/SiGe Bipolar Technology," ISSCC 2000/Session 12/Frequency Synthesizers and Dividers/Paper TP 12.6, pp. 206-207, 0-7803-5853-Aug. 2000.
J. Bock et al., "Sub 5 ps SiGe Bipolar Technology" IEDM, 0-7803-7462-Feb. 2002 pp. 763-766.
R. Hayami et al., "40 GHz 7.9mW low-power frequency divider IC using self-aligned selective-epitaxial-growth SiGe HBTs" IEEE Electronic Letters, vol. 38, No. 14, pp. 707-709, Jul. 4, 2002.

(Continued)

*Primary Examiner*—Timothy P. Callahan
*Assistant Examiner*—Cassandra Cox
(74) *Attorney, Agent, or Firm*—Lisa K. Jorgenson; Andre M. Szuwalski

(57) ABSTRACT

A static frequency divider circuit includes a first and second latch connected in series and a feedback path. Each of the latches includes a reading branch and a latching branch. The divider circuit further includes an inter-latch circuit that is connected between the latching branch of the first latch and the reading branch of the second latch. The inter-latch circuit is connected so as to reduce the current needs of the latching branches in both the first and second latches.

33 Claims, 3 Drawing Sheets

OTHER PUBLICATIONS

K. Ishii, et al., "Very-High Speed Si Bipolar Static Frequency Dividers with New T-Type Flip-Flops", IEEE Journal of Solid-State Circuits, vol. 30, No. 1, Jan. 1995, pp. 19-24, 0028-9200/95504.00.

M. Mokhtari, "100+ GHz Static Divide-By-2 Circuit in InP-DHBT Technology" IEEE 2002 GaAs Digest, pp. 291-293.

G. Ritzberger, "38 GHz Low-Power Static Frequency Divider in SiGe Bipolar Technology", IEEEE 2002, vol. 4, pp. 413-416, 0-7803-7448-Jul. 2002.

M. Sokolich, "A Low-Power 72.8-GHz Static Frequency Divider in AlInAs/InGaAs HBT Technology" IEEE Journal of Solid-State Circuits, vol. 36, No. 9, Sep. 2001, pp. 1328-1334.

K. Washio et al., "67-GHz Static Frequency Divider Using 0.2-am Self-Aligned SiGe HBTs" IEEE Transactions on Microwave Theory and Techniques, vol. 49, No. 1, Jan. 2001.

K. Washio et al., Ultra-High-Speed Scaled-down Self-Aligned SEG SiGe HBTs, IEEE 2002 pp. 767-770.

* cited by examiner

STATIC FREQUENCY DIVIDER WITH LOW POWER SUPPLY

BACKGROUND OF THE INVENTION

1. Technical Field of the Invention

The present invention relates to static frequency divider circuits.

2. Description of Related Art

A static frequency divider usually refers to a frequency divider consisting of two latches connected in series with a feedback path connected between. A commonly used static frequency divider circuit structure is illustrated in FIG. 1. Its configuration and operation are readily understood by those skilled in the art.

It has become of great interest to provide circuitry capable of operation at lower voltage supplies. For example, circuitry operable at 3.3 V instead of 5.0 V is now common. Movement towards still lower voltage levels is anticipated. Thus, a need exists for a static frequency divider circuit suitable for lower voltage operation. FIG. 2 illustrates just such a prior art circuit whose configuration and operation are well understood by those skilled in the art. It is of some importance, however, to point out, in comparing the conventional high voltage circuit of FIG. 1 to the low voltage circuit of FIG. 2, that the low voltage circuit fails to allow for an inter-stage buffer circuit with a full bipolar implementation due to the limited headroom which is available at low voltage (for example, 3.3 V) operation.

A need accordingly exists for a static frequency divider which can provide for high speed operation at lower supply voltages.

SUMMARY OF THE INVENTION

In accordance with one embodiment of the present invention, a static frequency divider circuit includes a first and second latch connected in series and having a feedback path. Each of the latches includes a reading branch and a latching branch. The divider circuit further comprises an inter-latch circuit that is connected between the latching branch of the first latch and the reading branch of the second latch. The inter-latch circuit is connected so as to provide for smaller currents in both latching branches as compared to the reading branches in both the first and second latches.

The inter-latch circuit preferably splits current draw with respect to the latching branch of the first latch and is parallel connected to the reading branch of the second latch so as to require smaller latching current compared to reading current in both the first and second latches.

The inter-latch circuit preferably comprises a pair of transistors whose base and emitter terminals are coupled to the first latch. More specifically, the base and emitter terminals of the pair of transistors are coupled to corresponding base/emitter terminals for a pair of transistors in the latching branch of the first latch. The base terminals of the pair of transistors for the inter-latch circuit are further coupled to collector terminals for a pair of transistors in the reading branch of the first latch.

The inter-latch circuit preferably comprises a pair of transistors whose collector terminals are coupled to the second latch. More specifically, the collector terminals are coupled to the corresponding collector terminals of a pair of transistors in the reading branch of the second latch. The collector terminals of the pair of transistors for the inter-latch circuit are further coupled to the base terminals of a pair of transistors in the reading branch of the first latch. Still further, the collector terminals of the pair of transistors for the inter-latch circuit are coupled to the base/collector terminals of a pair of transistors in the latching branch of the second latch.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 3:
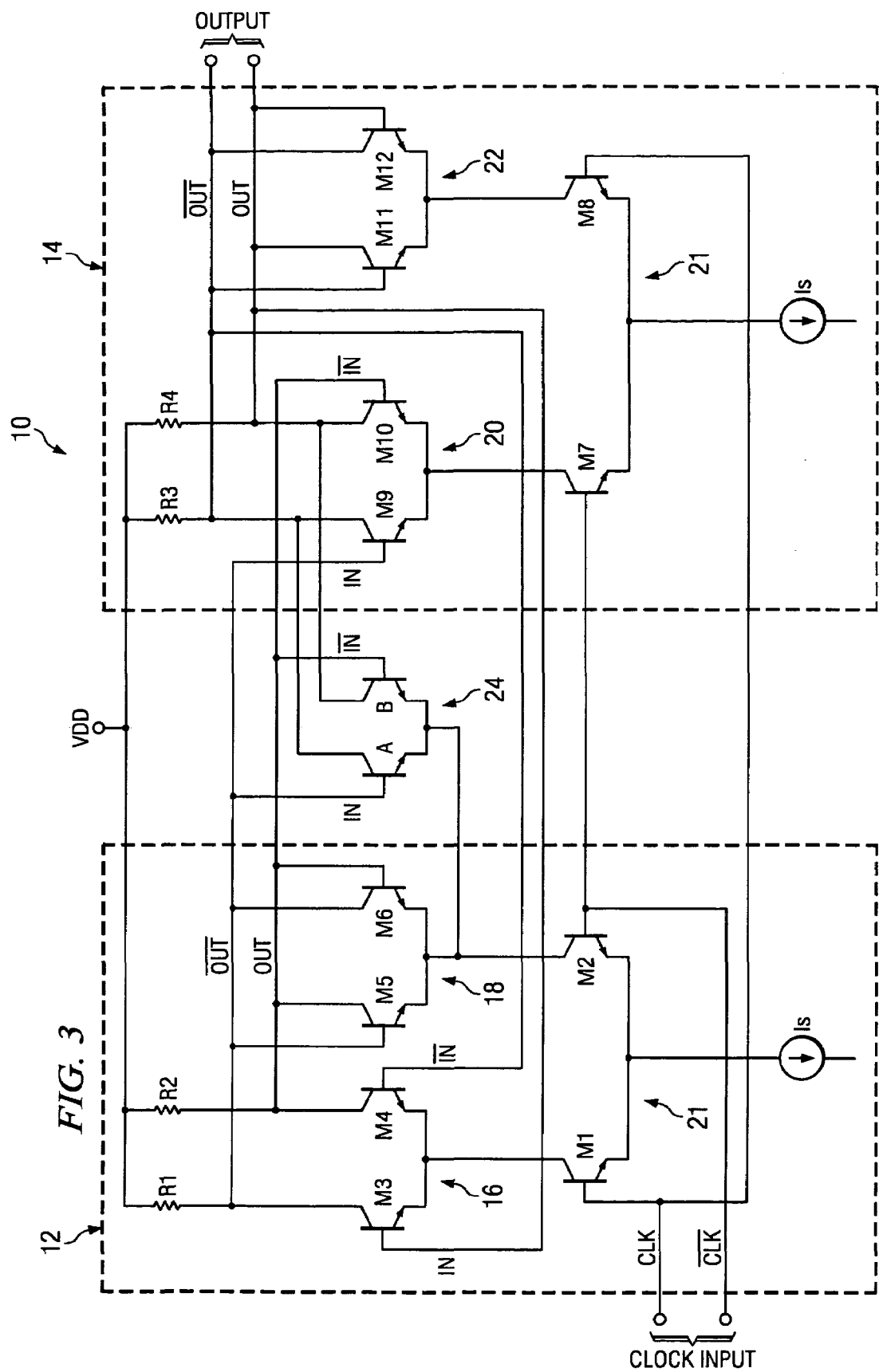
FIG. 3 is a schematic diagram of a low voltage static frequency divider in accordance with an embodiment of the present invention.

Reference is now made to FIG. 3 wherein there is shown a schematic diagram of an embodiment of a low voltage static frequency divider 10 in accordance with the present invention. The divider 10 includes a first latch 12 and a second latch 14 that are interconnected by both a series path and a feedback path. The first and second latches 12 and 14 are implemented as current mode logic (CML) D-type latches. CML is preferred because it offers fully differential routing of signal paths.

The first latch 12 includes a reading (or track) branch 16 and a latching (or latch) branch 18. Similarly, the second latch 14 includes a reading (track) branch 20 and a latching (latch) branch 22. The reading and latching branches are each formed from a pair of transistors (for example, M3/M4 and M5/M6) with common collector connected load resistors (for example, R1 and R2) and positive parallel feedback. Each of the first and second latches 12 and 14 further include a steering branch 21 coupled to both the reading and latching branches and operable responsive to clock signals to steer current through either of the reading or latching branches. The steering branch is also formed from a pair of transistors (for example, M1/M2) whose collectors are connected to the coupled emitters of the paired transistors for the reading and latching branches.

For each latch, the differential circuit inputs are provided at the base terminals of the pair of transistors for the reading branch and the differential circuit outputs are provided at the base/collector terminals of the pair of transistors for the latching branch. The differential clock input to each latch is provided at the base terminals of the pair of transistors for the steering branch.

The connection of the two CML D-type latches in series (differential output to input) with inverted clock signals applied to the differential clock inputs (in the steering branches 21) forms a master-slave D-type flip-flop circuit of known configuration. A ½ frequency divider is then formed from this master-slave flip-flop configuration by connecting the differential outputs of the slave flip-flop to the differential inputs of the master flip-flop.

Figure 1:
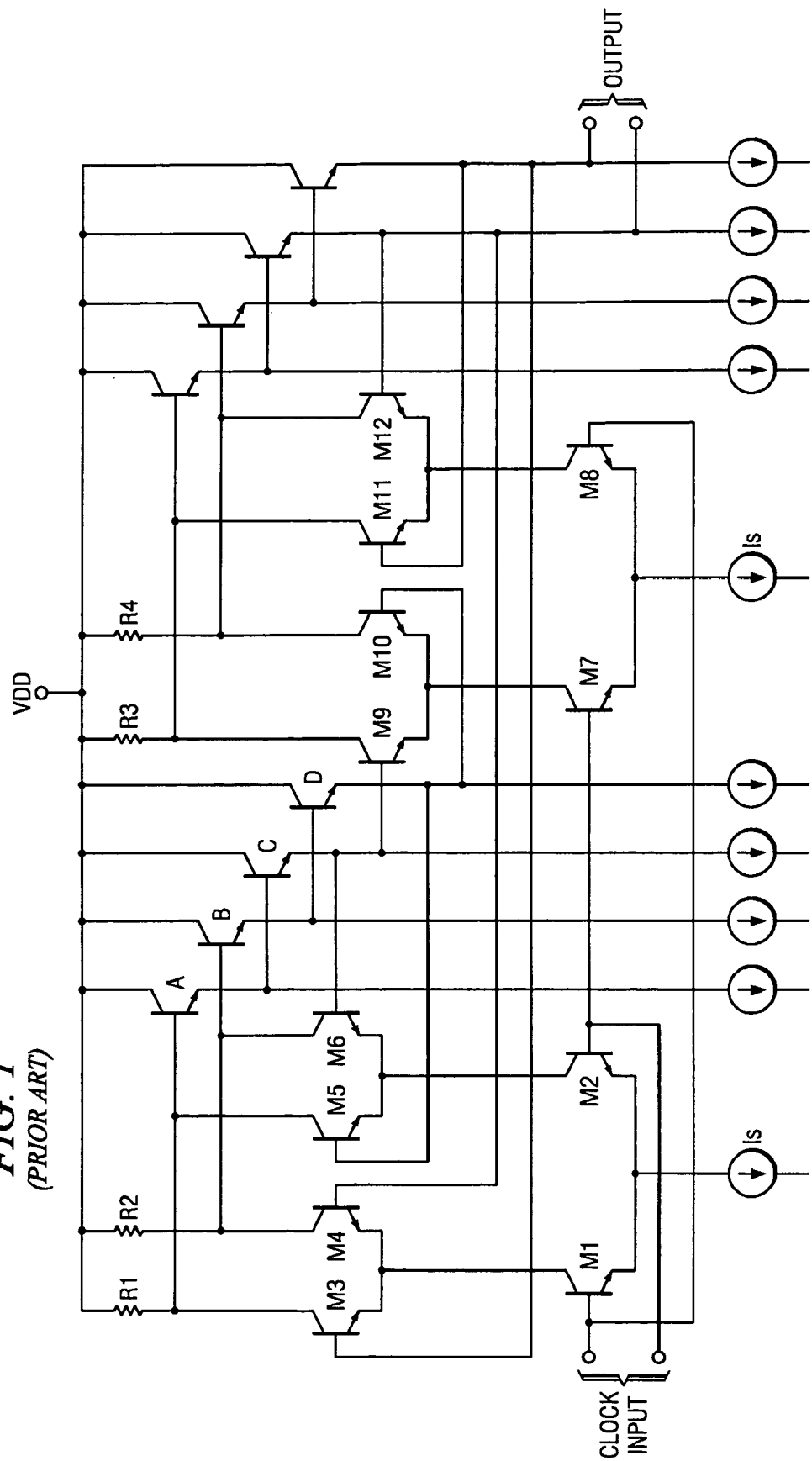
FIG. 1 is a schematic diagram of a prior art high voltage static frequency divider.
Figure 2:
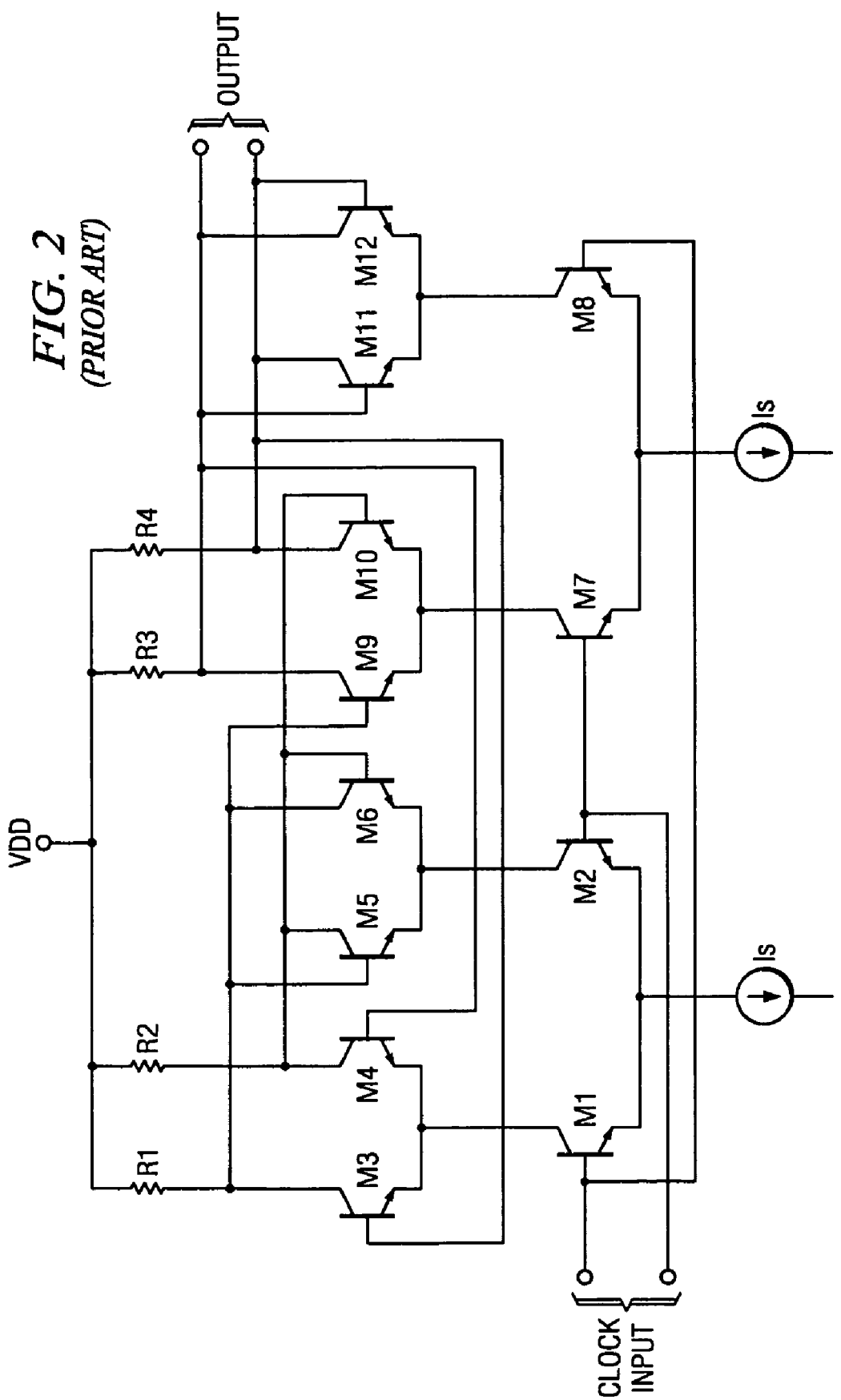
FIG. 2 is a schematic diagram of a prior art low voltage static frequency divider.

It will be understood by those skilled in the art that in one divider implementation, as illustrated in FIGS. 2 and 3, the output(bar) of the first latch is connected to the input of the second latch while the output of the first latch is connected to the input(bar) of the second latch. With this first and second latch negative differential series connection implementation, the differential feedback path is positive with the output(bar) of the second latch connected to the input(bar) of the first latch and the output of the second latch connected to the input of the first latch. In an alternative divider implementation, the output(bar) of the first latch is connected to the input(bar) of the second latch while the output of the first latch is connected to the input of the second latch. With this first and second latch positive differential series connection implementation, the differential feedback path is negative with the output(bar) of the second latch connected to the input of the first latch and the output of the second latch connected to the input(bar) of the first latch.

The divider 10 of FIG. 3 is similar in configuration to the prior art divider illustrated in FIG. 2. However, it is noted that the prior art divider of FIG. 2 suffers from concerns over insufficient speed. The divider 10 illustrated in FIG. 3 is configured to address this concern while facilitating operation at low voltages.

The divider 10, in either of the alternative differential feedback implementations, further includes an inter-latch circuit 24 which acts as a current path and couples the first latch 12 to the second latch 14 in addition to the series path connection. More particularly, the inter-latch circuit 24 couples the latching branch 18 of the first latch 12 to the reading branch 20 of the second latch 14 to provide a current path between the latches which is in addition to the differential series connection between the first and second latches 12 and 14 to provide the flip-flop circuit.

The inter-latch circuit 24 comprises first and second bipolar transistors A and B having emitter terminals coupled together and coupled to the coupled emitter terminals of transistors M5 and M6 in the latching branch 18 of the first latch 12. The base terminal of transistor A is coupled in common with the base terminals of the transistors M5 (in the first latch 12) and M9 (in the second latch 14) as well as to the collector terminal of transistor M3 (in the first latch 12). The base terminal of transistor B is coupled in common with the base terminals of the transistors M6 (in the first latch 12) and M10 (in the second latch 14) as well as to the collector terminal of transistor M4 (in the first latch 12).

The collector terminal of transistor A is coupled in common with collector terminals of transistors M9 and M12 (in the second latch 14) and also the base terminals of transistors M11 (in the second latch 14) and M4 (in the first latch 12). The collector terminal of transistor B is coupled in common with collector terminals of transistors M10 and M11 (in the second latch 14) and also the base terminals of transistors M12 (in the second latch 14) and M3 (in the first latch 12).

The common base and emitter connections which exist between the latching branch 18 of the first latch 12 and the inter-latch circuit 24 effectively split the latching branch 18 of the first latch 12 into two sub-branches. The first sub-branch, consisting of the latching branch 18, is still used for performing the conventional latching function within the first latch 12. However, advantageously, this function is performed with the use of a reduced amount of latching current in comparison to the normal reading current. The second sub-branch, consisting of the inter-latch circuit 24, is essentially parallel connected through the collector terminals of the transistors A and B to the reading branch 20 of the second latch 14. This effectively increases the amount of current being handled in the reading branch of the second latch 14 in comparison to the normal latching current within the second latch. Because the current in the latching branch is less than the current in the corresponding reading branch, for both master latch 12 and slave latch 14, the overall speed of the circuit is increased in comparison to the circuit of FIG. 2.

Additionally, by selectively choosing the transistor size ratio between the two sub-branches (i.e., between transistors M5/M6 and transistors A/B), the operational speed of the divider 10 can be optimized.

The static frequency divider 10 is preferably implemented as an integrated circuit device on a monolithic substrate.

The static frequency divider 10 is illustrated as utilizing bipolar transistors. It will, of course, be understood by those skilled in the art that the circuit could alternatively be implemented with MOS or CMOS FET devices if desired. In such an implementation, for example, the collector/emitter conduction terminals of the bipolar devices would correspond to drain/source conduction terminals in the FET devices and the base control terminal of the bipolar device would correspond to the gate control terminal in the FET. The reference to "first" and "second" conduction terminals herein refers to one or the other of source/drain terminals or one or the other of emitter/collector terminals with respect to the included transistors. The terms "first" and "second" are not intended to specifically refer to, or be limited to, a given terminal type.

The transistor pair A/B is illustrated with its collector terminals connected to the reading branch of the slave latch 14. It will, however, be understood that in an alternate configuration, the collector terminals may be connected to Vdd (through appropriate resistances, if needed) without any connection to the slave latch 14 circuitry. In this configuration, a splitting of the current draw in the latching branch of the master latch 12, along with the benefits which accrue therefrom, is still accomplished.

Although the circuit of FIG. 3 is illustrated operating with the use of positive voltages, it will be understood that the circuit design illustrated, with appropriate modifications as recognized by one skilled in the art, could instead be configured for operation with negative voltages.

As illustrated in FIG. 3, the circuit provides for a ½ frequency division operation. Other division ratios are supported with the use of the divider 10 of FIG. 3. For example, by cascading two dividers 10 in series, as is understood by those skilled in the art, a ¼ divider may be implemented. Similar cascade connections can be made to fabricate a 1/n divider provided the designer addresses frequency versus power sensitivity issues to ensure that each included divider 10 operates within its permitted frequency range with each successive division operation.

The terms "connected" or "coupled" as used herein do not necessarily require a direct connection among and between the recited components. Rather, it will be appreciated by those skilled in the art that the Figures are illustrative and indirect connections or couplings through other components or devices is possible without detracting from the operation of the invention.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A static frequency divider circuit, comprising:
a first and second latch connected in series and having a feedback path, each of the first and second latches including a reading branch and a latching branch; and
an inter-latch circuit, in addition to the series connection between the first and second latches, to connect the latching branch of the first latch to the reading branch of the second latch such that currents in the latching branches for both the first and second latches are less in comparison to the currents in the respective reading branch.

2. The circuit of claim 1 wherein the first and second latches and the inter-latch circuit are fully differential circuits.

3. The circuit of claim 1 wherein the inter-latch circuit comprises:
a differential transistor pair having emitter/base terminals connected to the first latch and collector terminals connected to the second latch.

4. The circuit of claim 3 wherein the emitter/base terminals are connected to the latching branch of the first latch and the collector terminals are connected to the reading branch of the second latch.

5. The circuit of claim 3 wherein the latching branch of the first latch comprises a latching differential pair of transistors and wherein the reading branch of the second latch comprises a reading differential pair of transistors, the differential transistor pair of the inter-latch circuit having its emitter/base terminals connected to the emitter/base terminals of the latching differential pair and having its collector terminals connected to the collector terminals of the reading differential pair.

6. The circuit of claim 1 wherein the inter-latch circuit comprises:
a differential transistor pair having first conduction/control terminals connected to the first latch and second conduction terminals connected to the second latch.

7. The circuit of claim 6 wherein the first conduction/control terminals are connected to the latching branch of the first latch and the second conduction terminals are connected to the reading branch of the second latch.

8. The circuit of claim 6 wherein the latching branch of the first latch comprises a latching differential pair of transistors and wherein the reading branch of the second latch comprises a reading differential pair of transistors, the differential transistor pair of the inter-latch circuit having its first conduction/control terminals connected to first conduction/control terminals of the latching differential pair and having its second conduction terminals connected to second conduction terminals of the reading differential pair.

9. The circuit of claim 1 wherein the first latch includes a current steering circuit having a first leg in the reading branch and a second leg in the latching branch, wherein the second latch includes load resistors and wherein the inter-latch circuit comprises a current path coupling between the load resistors of the second latch and the second leg of the current steering circuit in the first latch.

10. The circuit of claim 9 wherein the inter-latch circuit comprises a differential transistor pair having first conduction terminals connected to the second leg of the current steering circuit in the first latch and second conduction terminals connected to the load resistors of the second latch.

11. A circuit, comprising:
a first differential latch having a reading branch with inputs and a latching branch with outputs;
a second differential latch having a reading branch with inputs and a latching branch with outputs;
a first connection between the first differential latch outputs and the second differential latch inputs;
a second connection between the second differential latch outputs and the first differential latch inputs; and
an inter-latch circuit connecting the latching branch of the first latch to the reading branch of the second latch.

12. The circuit of claim 11 wherein the inter-latch circuit comprises a differential transistor pair having emitter/base terminals connected to the first latch and collector terminals connected to the second latch.

13. The circuit of claim 11 wherein the inter-latch circuit comprises a differential transistor pair having emitter/base terminals connected to the latching branch of the first latch and collector terminals connected to the reading branch of the second latch.

14. The circuit of claim 11 wherein the first latch includes a current steering circuit having a first leg in the reading branch and a second leg in the latching branch, wherein the second latch includes load resistors and wherein the inter-latch circuit comprises a current path coupling between the load resistors of the second latch and the second leg of the current steering circuit in the first latch.

15. The circuit of claim 14 wherein the inter-latch circuit comprises a differential transistor pair having first conduction terminals connected to the second leg of the current steering circuit in the first latch and second conduction terminals connected to the load resistors of the second latch.

16. The circuit of claim 11, wherein:
the latching branch of the first differential latch comprises a latching differential pair of transistors;
the reading branch of the second differential latch comprises a reading differential pair of transistors; and
the inter-latch circuit comprises a differential transistor pair having its emitter/base terminals connected to the emitter/base terminals of the latching differential pair and having its collector terminals connected to the collector terminals of the reading differential pair.

17. The circuit of claim 11 wherein the first connection is a positive differential series connection and the second connection is a negative differential feedback connection.

18. The circuit of claim 11 wherein the first connection is a negative differential series connection and the second connection is a positive differential feedback connection.

19. The circuit of claim 11 wherein the first and second differential latches are current mode logic circuits.

20. A static frequency divider circuit, comprising:
a first latch including a reading branch and a split latching branch comprising a latching sub-branch and interconnect sub-branch;
a second latch including a reading branch and a latching branch, the interconnect sub-branch being connected to the reading branch of the second latch;
a series connection between the latching sub-branch of the first latch and the reading branch of the second latch; and
a feedback connection between the latching branch of the second latch and the reading branch of the first latch.

21. The circuit of claim 20 wherein the interconnect sub-branch provides for lower current draw in the latching sub-branch in the first latch and the latching branch of the second latch in comparison to current draw in the corresponding reading branches.

22. The circuit of claim 20 wherein the series connection is a positive connection and the feedback connection is a negative connection.

23. The circuit of claim 20 wherein the series connection is a negative connection and the feedback connection is a positive connection.

24. The circuit of claim 20 wherein:
the latching sub-branch comprises a first differential transistor pair;
the interconnect sub-branch comprises a second differential transistor pair; and the reading branch of the second latch comprises a third differential transistor pair.

25. The circuit of claim 24 wherein a transistor size ratio between the first and second differential transistor pairs is trimmed to optimize circuit speed.

26. The circuit of claim 24 wherein emitter/base terminals of the first differential transistor pair are connected to emitter/base terminals of the second differential transistor pair and wherein collector terminals of the second differential transistor pair are connected to collector terminals of the third differential transistor pair.

27. A static frequency divider circuit, comprising:
a current mode logic D-type master-slave flip flop circuit including a master latch output and a slave latch input connected by a series differential connection;
a differential feedback connection for the current mode D-type master-slave flip flop circuit; and
a differential current splitting circuit connected between the master latch output and slave latch input of the flip-flop circuit.

28. A static frequency divider circuit, comprising:
a current mode logic D-type master-slave flip flop circuit;
a differential feedback connection for the current mode D-type master-slave flip flop circuit; and
a differential current splitting circuit connected between a master latch and slave latch of the flip-flop circuit;
wherein the differential current splitting circuit comprises a first differential transistor pair having its emitter/base terminals connected to the master latch and its collector terminals connected to the slave latch.

29. The circuit of claim 28 wherein the master latch includes a second differential transistor pair having its emitter/base terminals connected to the emitter/base terminals of the first differential transistor pair.

30. The circuit of claim 28 wherein the slave latch includes a third differential transistor pair having its collector terminals connected to the collector terminals of the first differential transistor pair.

31. The circuit of claim 28 wherein the differential feedback connection is a positive connection.

32. A static frequency divider circuit, comprising:
a current mode logic D-type master-slave flip flop circuit;
a differential feedback connection for the current mode D-type master-slave flip flop circuit; and
a differential current splitting circuit connected between a master latch and slave latch of the flip-flop circuit;
wherein the master latch includes a current steering circuit having a first leg for a reading branch and a second leg for a latching branch, wherein the slave latch includes load resistors and wherein the differential current splitting circuit comprises a current path coupling between the load resistors of the slave latch and the second leg of the current steering circuit in the master latch.

33. The circuit of claim 32 wherein the differential current splitting circuit comprises a differential transistor pair having first conduction terminals connected to the second leg of the current steering circuit in the master latch and second conduction terminals connected to the load resistors of the slave latch.

* * * * *